United States Patent
Yamamoto et al.

(10) Patent No.: US 9,360,756 B2
(45) Date of Patent: Jun. 7, 2016

(54) COMPOSITION FOR FORMING FINE RESIST PATTERN AND PATTERN FORMATION METHOD USING SAME

(71) Applicants: Kazuma Yamamoto, Shizuoka (JP); Masahiro Ishii, Shizuoka (JP); Takashi Sekito, Shizuoka (JP); Hiroshi Yanagita, Shizuoka (JP); Shigemasa Nakasugi, Shizuoka (JP); Go Noya, Shizuoka (JP)

(72) Inventors: Kazuma Yamamoto, Shizuoka (JP); Masahiro Ishii, Shizuoka (JP); Takashi Sekito, Shizuoka (JP); Hiroshi Yanagita, Shizuoka (JP); Shigemasa Nakasugi, Shizuoka (JP); Go Noya, Shizuoka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/431,512

(22) PCT Filed: Oct. 1, 2013

(86) PCT No.: PCT/JP2013/076635
§ 371 (c)(1),
(2) Date: Mar. 26, 2015

(87) PCT Pub. No.: WO2014/054606
PCT Pub. Date: Apr. 10, 2014

(65) Prior Publication Data
US 2015/0253669 A1 Sep. 10, 2015

(30) Foreign Application Priority Data
Oct. 1, 2012 (JP) .................. 2012-219657

(51) Int. Cl.
| | | |
|---|---|---|
| G03F 7/11 | (2006.01) |
| G03F 7/16 | (2006.01) |
| G03F 7/32 | (2006.01) |
| G03F 7/26 | (2006.01) |
| C08F 220/26 | (2006.01) |
| C08F 220/30 | (2006.01) |
| H01L 21/027 | (2006.01) |
| H01L 21/033 | (2006.01) |
| C08F 12/24 | (2006.01) |
| C08F 20/30 | (2006.01) |
| G03F 7/039 | (2006.01) |
| G03F 7/40 | (2006.01) |
| C09D 129/02 | (2006.01) |
| C09D 133/14 | (2006.01) |
| C09D 137/00 | (2006.01) |
| G03F 7/038 | (2006.01) |

(52) U.S. Cl.
CPC .............. *G03F 7/168* (2013.01); *C08F 12/24* (2013.01); *C08F 20/30* (2013.01); *C08F 220/26* (2013.01); *C08F 220/30* (2013.01); *C09D 129/02* (2013.01); *C09D 133/14* (2013.01); *C09D 137/00* (2013.01); *G03F 7/0382* (2013.01); *G03F 7/0397* (2013.01); *G03F 7/11* (2013.01); *G03F 7/26* (2013.01); *G03F 7/32* (2013.01); *G03F 7/325* (2013.01); *G03F 7/40* (2013.01); *G03F 7/405* (2013.01); *H01L 21/0274* (2013.01); *H01L 21/0338* (2013.01)

(58) Field of Classification Search
CPC ..... G03F 7/0045; G03F 7/0382; G03F 7/168; G03F 7/40; G03F 7/32; G03F 7/11; G03F 7/26; C09D 129/02; C09D 137/00; C08F 220/26; C08F 220/30; H01L 21/0271; H01L 21/0338; H01L 21/0274
USPC .............. 430/271.1, 322, 325, 329, 330, 331; 524/558; 526/320, 326
See application file for complete search history.

(56) References Cited

U.S. PATENT DOCUMENTS

| | | | |
|---|---|---|---|
| 5,002,008 A | 3/1991 | Ushijima et al. | |
| 6,579,657 B1 | 6/2003 | Ishibashi et al. | |
| 7,595,141 B2 * | 9/2009 | Kudo | G03F 7/40 430/270.1 |
| 7,745,093 B2 * | 6/2010 | Nishibe | G03F 7/40 430/270.1 |
| 8,119,325 B2 * | 2/2012 | Kozawa | G03F 7/40 430/270.1 |
| 8,349,542 B2 * | 1/2013 | Kozawa | G03F 7/0035 430/313 |
| 8,945,822 B2 * | 2/2015 | Nozaki | C08K 5/17 430/270.1 |
| 2007/0123623 A1 * | 5/2007 | Kozawa | G03F 7/40 524/318 |
| 2008/0073322 A1 * | 3/2008 | Nozaki | C08K 5/17 216/49 |
| 2010/0239984 A1 * | 9/2010 | Tsubaki | G03F 7/0392 430/325 |
| 2011/0250543 A1 * | 10/2011 | Tsubaki | G03F 7/0397 430/325 |
| 2013/0089821 A1 | 4/2013 | Hirano | |
| 2013/0122425 A1 | 5/2013 | Yoshida et al. | |
| 2013/0183626 A1 | 7/2013 | Namiki et al. | |
| 2014/0242359 A1 * | 8/2014 | Nakamura | G03F 7/40 428/201 |

FOREIGN PATENT DOCUMENTS

| | | |
|---|---|---|
| JP | 2-132444 A | 5/1990 |
| JP | 10-73927 A | 3/1998 |
| JP | 2003-84459 A | 3/2003 |

(Continued)

*Primary Examiner* — Amanda C Walke
(74) *Attorney, Agent, or Firm* — Mitchell Brustein

(57) ABSTRACT

The present invention provides a fine pattern-forming composition enabling to form a resist pattern having high dry etching resistance, and also provides a pattern formation method using that composition. This formation method hardly causes pipe blockages in the production process. The composition is used for miniaturizing a resist pattern by fattening in a process of forming a negative resist pattern from a chemically amplified resist composition, and comprises a polymer containing a repeating unit having a hydroxyaryl group and an organic solvent not dissolving the negative resist pattern. In the formation method, the fine pattern-forming composition and the resist composition are individually cast with the same coating apparatus, so as to prevent pipe blockages.

12 Claims, No Drawings

(56) References Cited

FOREIGN PATENT DOCUMENTS

| JP | 2005-300853 A | 10/2005 |
| JP | 2008-518260 A | 5/2008 |
| JP | 2008-310314 A | 12/2008 |
| JP | 2010-49247 A | 3/2010 |
| JP | 2011-257499 A | 12/2011 |
| JP | 2013-64829 A | 4/2013 |
| JP | 2013-117710 A | 6/2013 |
| JP | 2013-145290 A | 7/2013 |

* cited by examiner

COMPOSITION FOR FORMING FINE RESIST PATTERN AND PATTERN FORMATION METHOD USING SAME

This application is a United States National Stage Patent Application under 35 U.S.C. §371 of International Patent Application No. PCT/JP2013/076635, filed Oct. 1, 2013, which claims priority to Japanese Patent Application No. 2012-219657, filed Oct. 1, 2012, the contents of which are being hereby incorporated herein by reference.

TECHNICAL FIELD

The present invention relates to a composition for obtaining a fine resist pattern miniaturized by fattening or thickening a beforehand formed resist pattern in a production process of semiconductor devices and the like, and this invention also relates to a pattern formation method employing that composition.

BACKGROUND ART

In manufacturing semiconductor devices, resist patterns have been required to be made minute enough to meet increased integration density and highly accelerated processing speed in LSIs. Resist patterns are normally formed in photo-lithographic processes from, for example, positive-working type resists, whose solubilities to alkali developers are increased by exposure to light. Accordingly, the resists in the areas exposed to light are removed with the alkali developers to form positive resist patterns. However, the fineness of the resultant patterns greatly depends on the exposure methods and light sources, and hence in order to stably produce fine resist patterns, a huge investment is necessary to install special and expensive facilities and equipments needed for the exposure methods and light sources capable of ensuring the fineness.

In view of that, there are various techniques studied for further miniaturizing resist patterns beforehand formed by conventional methods. For example, they include a practical method in which a resist pattern stably produced by a conventional method is coated with a composition comprising a water-soluble resin and optional additives (hereinafter, such composition is often referred to as "a fine pattern-forming composition") so as to fatten or thicken the resist pattern and thereby to decrease the diameter of holes and/or the width of furrow lines separating the ridges in the pattern.

Specifically, the following processes and composition are known, that is:

(1) a process comprising the steps of coating a conventionally formed resist pattern with a fine pattern-forming composition crosslinkable by an acid, heating the resist pattern to diffuse the acid contained in the resist so that the composition on the resist may be crosslinked to form a crosslinked layer at the interface therebetween as a covering layer of the resist pattern, and removing the uncrosslinked composition with a developer to fatten or thicken the resist pattern and thereby to decrease the diameter of holes and/or the width of furrow lines separating the ridges in the pattern (see, Patent documents 1 and 2);

(2) a process comprising the steps of coating a conventionally formed resist pattern with a fine pattern-forming composition comprising a copolymer derived from (meth)acrylic acid monomers and water-soluble vinyl monomers, and heating the resist pattern to shrink and thereby to become finer (see, Patent document 3); and (3) a water-soluble fine pattern-forming composition which comprises a polymer containing amino groups, in particular, primary amines and which is used for covering a photoresist pattern (see, Patent document 4).

In each of the above processes, there are two casting procedures. One is the step of casting a resist composition on the substrate, and the other is the step of casting a fine pattern-forming composition on the resist pattern. Those two casting procedures are often carried out by means of the same coating apparatus so as to simplify the production facilities. Further, since resist patterns are usually produced in a clean room having limited space, it saves the space in the clean room to use the same coating apparatus.

However, the present inventors have found that there may be a problem if the same coating apparatus is used to cast the resist composition and the fine pattern-forming composition. Specifically, generally when a composition is cast with a coating apparatus, excess of the composition is discharged as a waste solution. In addition, also when excess of the composition is washed way with a detergent such as an edge-rinsing solution, the mixture of the composition and the detergent is discharged as another waste solution. Those waste solutions are drained out of the apparatus through pipes, and hence in general they partly adhere to and remain on the inside walls of the pipes unless the pipes are cleaned every time. Accordingly, if the same coating apparatus is used to cast the resist composition and the fine pattern-forming composition, they are inevitably brought in contact with each other in the pipes. At that time, solid precipitates are often deposited by conventional fine pattern-forming compositions. Since the precipitates may choke up the pipes to lower the productivity, it has been desired to improve this problem.

PRIOR ART DOCUMENTS

Patent Documents

[Patent document 1] Japanese Patent Laid-Open No. 10(1998)-73927

[Patent document 2] Japanese Patent Laid-Open No. 2005-300853

[Patent document 3] Japanese Patent Laid-Open No. 2003-84459

[Patent document 4] Japanese Patent Laid-Open No. 2008-518260

DISCLOSURE OF INVENTION

Problem to be Solved by the Invention

In consideration of the above problem, it is an object of the present invention to provide a fine pattern-forming composition which enables to form at least as fine a resist pattern as conventional fine pattern-forming compositions and which has excellent compatibility with normal resist compositions.

Means for Solving Problem

The present invention resides in a fine pattern-forming composition for miniaturizing a resist pattern by fattening in a process of forming a negative resist pattern from a chemically amplified resist composition,
comprising
a polymer containing a repeating unit having a hydroxyaryl group, and an organic solvent not dissolving said negative resist pattern.

The present invention also resides in a method for forming a fine negative resist pattern, comprising the steps of
(1) coating a semiconductor substrate with a chemically amplified resist composition, to form a photoresist layer;
(2) exposing to light said semiconductor substrate coated with said photoresist layer;
(3) developing said photoresist layer with an organic solvent developer after said exposing step, to form a photoresist pattern;
(4) coating said photoresist pattern with the above fine pattern-forming composition;
(5) heating the coated photoresist pattern, and
(6) washing to remove excess of the fine pattern-forming composition.

Effect of the Invention

The present invention provides a fine pattern-forming composition that can make a resist pattern finer by fattening or thickening. The resist pattern formed from this composition has at least as high dry etching resistance as patterns formed from conventional fine pattern-forming compositions. Further, even if the same coating apparatus is used to cast the composition of the present invention and a photoresist composition, the present fine pattern-forming composition does not deposit solid precipitates when mixed with the resist composition and hence hardly causes pipe blockages. Consequently, the fine pattern-forming composition according to the present invention enables to produce semiconductor devices efficiently.

BEST MODE FOR CARRYING OUT THE INVENTION

Embodiments according to the present invention are described below in detail.
Fine Pattern-Forming Composition
The fine pattern-forming composition of the present invention comprises a solvent and a polymer having a particular structure. The polymer adopted in the present invention contains a repeating unit having a hydroxyaryl group. Here, the term "hydroxyaryl group" means a group comprising one or more hydroxyls (—OH) connecting to an aromatic ring-containing skeleton, such as, benzene skeleton, naphthalene skeleton or anthracene skeleton. This central skeleton is not particularly restricted as long as it contains an aromatic ring, but benzene or naphthalene skeleton is preferred in view of the solubility to the solvent. The hydroxyaryl group may contain two or more hydroxyls connecting to the skeleton, and substituents other than hydroxyl may connect to the skeleton unless they impair the effect of the present invention. Examples of the substituents include alkyl groups, alkoxy groups, aryl groups, halogens, carbonyl groups, carboxyl groups, sulfa groups and amino groups. Further, the hydroxyaryl group may contain a cyclic structure formed by a hydrocarbon chain linking to two carbon atoms participating in the aryl group.

The hydroxyaryl group may be positioned either at the main chain or at the side chain of the polymer.

The repeating unit is derived from, for example, the following monomers:

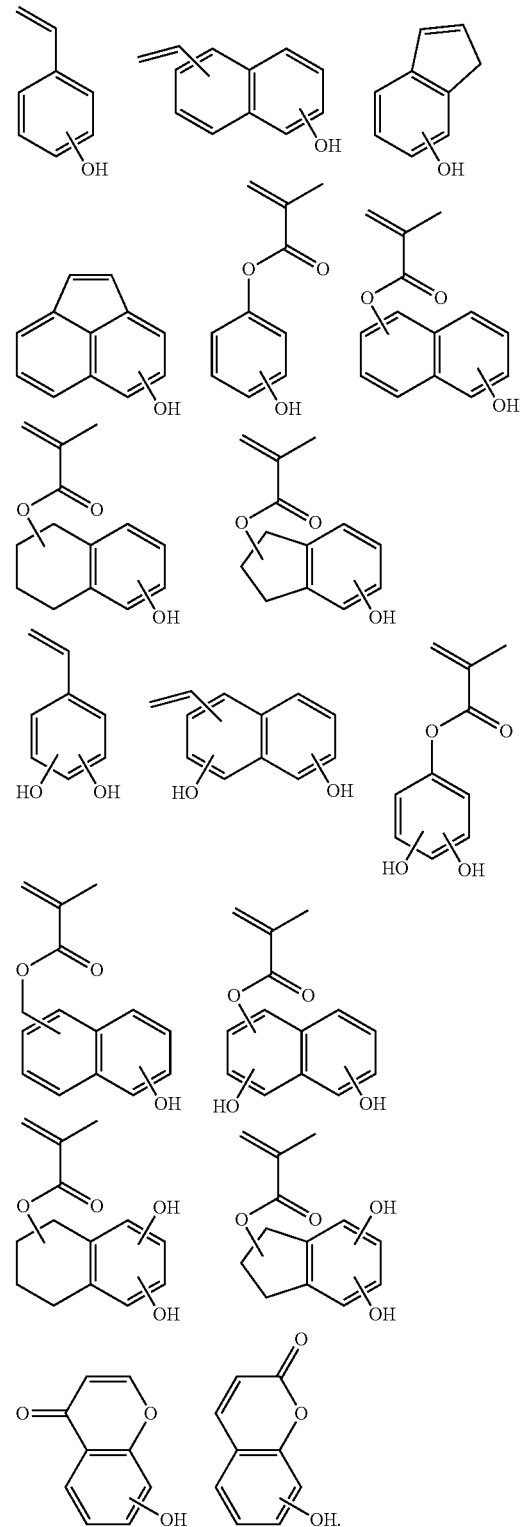

The polymer used in the present invention can be synthesized by polymerizing the above exemplified monomers. However, the above examples by no means restrict the repeating unit having a hydroxyaryl group. For example, the repeating unit may be derived from a monomer having many hydroxyls connecting to an aromatic ring, and other substituents may connect to the ring.

The polymer in the present invention may comprise only the repeating unit having a hydroxyaryl group, but may contain other repeating units such as units derived from acrylic acid, methacrylic acid and vinyl alcohol. In that case, if the repeating unit having a hydroxyaryl group is contained more than other repeating units in the polymer, the effect of the present invention tends to appear remarkably. Accordingly, the polymer contains the repeating unit having a hydroxyaryl group in an amount of preferably 60 mol % or more, further preferably 80 mol % or more, based on the number of moles of all the repeating units.

In the present invention, two or more polymers may be used in combination. It is possible in that case to use in combination a polymer containing no or a small amount of the repeating unit having a hydroxyaryl group. However, in order to ensure the effect of the present invention, the amount of the hydroxyaryl-containing repeating unit is preferably in the above range, based on the number of moles of all the repeating units.

There are no particular restrictions on the molecular weight of the polymer used in the present invention, but the weight average molecular weight thereof is generally 3000 to 200000, preferably 5000 to 150000. Here, the "weight average molecular weight" means a polystyrene-reduced weight average molecular weight measured by gel permeation chromatography.

The solvent used in the present invention is required not to dissolve the resist pattern formed before casting the fine pattern-forming composition. Specifically, the solvent is selected from organic solvents such as ketones and esters in consideration of the solubility of the resist pattern. Examples of the solvent include 2-heptanone, methyl isobutyl ketone (hereinafter, referred to as "MIBK"), butyl acetate, propyl acetate, and pentyl acetate. Among them, 2-heptanone and butyl acetate are particularly preferred. In contrast, unfavorable solvents are, for example, ethyl lactate, propyleneglycol monomethyl ether acetate (hereinafter, referred to as "PGMEA"), propyleneglycol monomethyl ether (hereinafter, referred to as "PGME") and cyclohexanone because they easily dissolve the resist pattern.

As described above, the fine pattern-forming composition of the present invention comprises a polymer having a particular structure. The content of the polymer is freely selected according to the size and kind of the resist pattern and also to the aimed pattern fineness. However, the polymer having a particular structure is contained in an amount of generally 0.1 to 10 wt %, preferably 1.0 to 7.0 wt % based on the total weight of the composition.

Further, the fine pattern-forming composition of the present invention can contain other additives, if necessary. Examples of the additives include surfactants, germicides, antibacterial agents, antiseptic agents and anti-mold agents.

Pattern Formation Method

The following is an explanation of the method according to the present invention for forming a fine resist pattern. The pattern formation method described below is a typical one using the fine pattern-forming composition of the present invention.

First, a chemically amplified photoresist is cast on a surface, which may be pretreated if necessary, of a substrate, such as a silicon substrate, according to a known coating method such as spin-coating method, to form a chemically amplified photoresist layer. Prior to casting the photoresist, an antireflective coat may be beforehand formed on the substrate surface. The antireflective coat can improve the section shape and the exposure margin.

Any known chemically amplified photoresist can be used in the pattern formation method of the present invention. The chemically amplified photoresist generates an acid when exposed to radiation such as UV light, and the acid serves as a catalyst to promote chemical reaction by which solubility to an alkali developer is changed within the areas irradiated with the radiation to form a pattern. For example, the chemically amplified photoresist comprises an acid-generating compound, which generates an acid when exposed to radiation, and an acid-sensitive functional group-containing resin, which decomposes in the presence of acid to form an alkali-soluble group such as phenolic hydroxyl or carboxyl group. The photoresist may comprise an alkali-soluble resin, a crosslinking agent and an acid-generating compound.

In the present invention, the photoresist in the areas where the alkali-soluble groups are not formed is removed with an organic solvent developer to obtain a photoresist pattern. Accordingly, the obtained pattern is of a negative type, in which the resist remains in the areas exposed to radiation. This means that a negative pattern is formed from the chemically amplified photoresist that functions as a positive-working type resist when developed with a normal alkali developer.

According to necessity, the chemically amplified photoresist layer formed on the substrate is prebaked, for example, on a hot plate to remove solvent contained in the photoresist, to form a photoresist film normally having a thickness of about 50 to 500 nm. The prebaking temperature depends on the solvent and the photoresist, but is normally about 50 to 200° C., preferably about 70 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. In the present invention, the resist is developed with an organic solvent developer. Here, any organic solvent developer can be used as long as it does not dissolve the photoresist film in the part exposed to radiation so as to become soluble in an alkaline aqueous solution but as long as it dissolves the film in the part unexposed to radiation so as to remain insoluble in an alkaline aqueous solution. The photoresist film in the part insoluble in an alkaline aqueous solution is generally easily dissolved in organic solvents, and hence the organic solvent developer can be selected from a relatively wide range of solvents. Actually, it can be selected from hydrocarbons and polar organic solvents such as ketones, esters, alcoholic solvents, amides and ethers.

Examples of the ketones include 1-octanone, 2-octanone, 2-nonanone, 4-heptanone, 1-hexanone, 2-hexanone, diisobutyl ketone, cyclohexanone, methyl ethyl ketone, methyl isobutyl ketone, and acetophenone.

Examples of the esters include ethyl acetate, n-propyl acetate, isopropyl acetate, n-butyl acetate, propyleneglycol monomethyl ether acetate, ethyleneglycol monoethyl ether acetate, diethyleneglycol monobutyl ether acetate, diethyleneglycol monoethyl ether acetate, 3-methoxybutyl acetate, 3-methyl-3-methoxybutyl acetate, ethyl lactate, butyl lactate, and propyl lactate.

Examples of the alcoholic solvents include alcohols, such as ethyl alcohol, n-propyl alcohol, isopropyl alcohol, n-butyl alcohol, sec-butyl alcohol, n-hexyl alcohol, and n-heptyl alcohol; glycols, such as ethylene glycol, propylene glycol, and diethylene glycol; and glycol ethers, such as ethyleneglycol monomethyl ether, propyleneglycol monomethyl ether, diethyleneglycol monomethyl ether, triethyleneglycol monoethyl ether, and methoxymethyl butanol.

Examples of the ethers include the above glycol ethers, di-n-propyl ether, di-n-butyl ether, dioxane, and tetrahydrofuran.

Examples of the amides include N-methyl-2-pyrrolidone, N,N-dimethylacetamide, and N,N-dimethylformamide.

Examples of the hydrocarbons include aromatic hydrocarbons, such as toluene and xylene; and aliphatic hydrocarbons, such as pentane, hexane, octane and decane.

Those organic solvents can be used in combination of two or more, and also can be combined with inorganic solvents such as water unless they impair the effect of the present invention.

After the development, the resist pattern is preferably rinsed (washed) with a rinse solution. In the present invention, the rinsing procedure is preferably carried out with a rinse solution containing at least one organic solvent selected from the group consisting of alkanes, ketones, esters, alcohols, amides and ethers.

Examples of the rinse solution used in the rinsing procedure after the development include n-hexyl alcohol, n-heptyl alcohol and benzyl alcohol. Two or more of those solvents may be mixed, and further they may be mixed with other solvents including water.

The rinse solution may contain water in an amount of preferably 10 wt % or less, further preferably 5 wt % or less, particularly preferably 3 wt % or less. If the water content is 10 wt % or less, the development can be favorably completed. The rinse solution may contain a proper amount of surfactants.

Subsequently, the obtained resist pattern is miniaturized by applying the fine pattern-forming composition of the present invention. However, prior to applying the composition, the resist pattern may be subjected to surface treatment by applying water or an organic solvent not dissolving the pattern. This surface treatment improves the coatability of the composition, so that the composition can be spread evenly. This means that the coatability can be improved without adding additives for improving the coatability, such as surfactants, into the composition. This treatment is often referred to as "pre-wet treatment".

Thereafter, the fine pattern-forming composition of the present invention is cast so as to cover the whole resist pattern, and consequently the resist pattern is fatten or thicken by the interaction between the resist pattern and the composition. This interaction is presumed to be impregnation of the polymer into the resist and/or adhesion of the polymer onto the resist, whereby the resist pattern is fattened or thickened.

Specifically, the fine pattern-forming composition of the present invention soaks into and/or attaches onto the inner walls of grooves or holes in the resist pattern, to fatten or thicken the pattern. As a result, the composition narrows the width of furrow lines separating the ridges in the pattern, and thereby enables to essentially miniaturize the pitch size and hole opening size of the resist pattern more than the resolution limit.

In the pattern formation method of the present invention, the fine pattern-forming composition can be cast according to any of the coating methods conventionally adopted for casting photoresist resin compositions. For example, spin coating method can be used.

If necessary, the resist pattern coated with the fine pattern-forming composition can be heated by prebaking. The prebaking may be carried out while the temperature is either kept constant or elevated step-by-step. After coated with the fine pattern-forming composition, the resist pattern is heated at, for example, 40 to 200° C., preferably 80 to 160° C., for 10 to 300 seconds, preferably 30 to 120 seconds. This heating procedure is for the purpose of helping the polymer to soak into and/or attach onto the resist.

As a result of casting and heating the fine pattern-forming composition, the resist pattern is so fattened as to increase the width of the ridge lines in the pattern and to decrease the diameter of the hole pattern. Those dimension changes can be adequately controlled by selecting the conditions such as the temperature and time of heating, the kind of the photoresist resin composition and the like. Accordingly, the conditions are determined according to how far the resist pattern must be miniaturized, namely, how much the width of the ridge lines in the resist pattern must be broadened and/or how much the diameter of the hole pattern must be reduced. However, each dimension change in the resist pattern normally ranges from 5 to 30 nm in difference between before and after application of the fine pattern-forming composition.

After the resist pattern is essentially miniaturized, the fine pattern-forming composition unreacted with the resist, namely, excess of the composition can be rinsed away with water or solvents, if necessary. The water or solvents for rinsing must have poor ability to dissolve the fine pattern-forming composition soaked into or attached onto the resist pattern but must have high ability to dissolve the extra composition, which is neither soaked into nor attached onto the resist pattern. It is preferred to use a solvent contained in the fine pattern-forming composition, and it is particularly preferred to use pure water for rinsing.

In the way described above, the resist pattern immediately after developed undergoes dimension change by the action of the fine pattern-forming composition, so as to obtain an essentially miniaturized resist pattern. The resist pattern thus produced by use of the fine pattern-forming composition according to the present invention is advantageously used in producing semiconductor devices or the like having finer patterns.

The present invention is further explained by use of the following examples.

Resist Pattern Formation Example

An 8-inch silicon wafer was spin-coated with a bottom antireflective coat-forming composition (AZ ArF-1C5D [trademark], manufactured by AZ Electronic Materials (Japan) K.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by AZ Electronic Materials (Japan) K.K.) was cast thereon and baked at 110° C. for 60 seconds to form a resist layer of 120 nm thickness. The obtained wafer was then subjected to pattern exposure by means of an ArF-beam (193 nm) exposure apparatus (manufactured by Nikon Corporation), and thereafter baked at 110° C. for 60 seconds. Successively, the wafer was subjected to development (negative development) for 30 seconds by use of 2-heptanone as a developer, to obtain a resist pattern having a pitch size of 110 nm and a hole size of 60 nm.

Example of Polymer Synthesis (Synthesis of PQMA/MAdMA (80/20) Copolymer

In a reaction vessel equipped with a stirrer, a condenser and a thermostat, methyl amyl ketone (2100 parts), 4-hydroxyphenyl methacrylate (PQMA, 670 parts), 2-methyladamantine-2-yl methacrylate (MAdMA, 220 parts) and dimethyl 2,2'-azobis(2-methyl isobutylate) (radical polymerization initiator, 9 parts) were mixed to prepare a monomer solution and then purged with nitrogen gas for 30 minutes. The reaction vessel was placed in a heating apparatus in which the temperature was kept at 80° C., and thereby the monomer solution was kept at 80° C. for 6 hours.

After cooled to room temperature, the solution was poured into n-heptane (15000 parts) to form white precipitates. The precipitates were isolated by filtration under reduced pressure, and dissolved in tetrahydrofuran (2000 parts). The obtained solution was again poured into n-heptane (15000 parts) to form white precipitates. The precipitates were isolated by filtration under reduced pressure, and dried overnight at 50° C. in a vacuum oven to obtain white powdery PQMA/MAdMA (80/20) copolymer.

The above procedure was repeated except for changing the kind and amount of the monomer, to prepare polymers shown in Table 1. The polymers were synthesized from the following monomers:

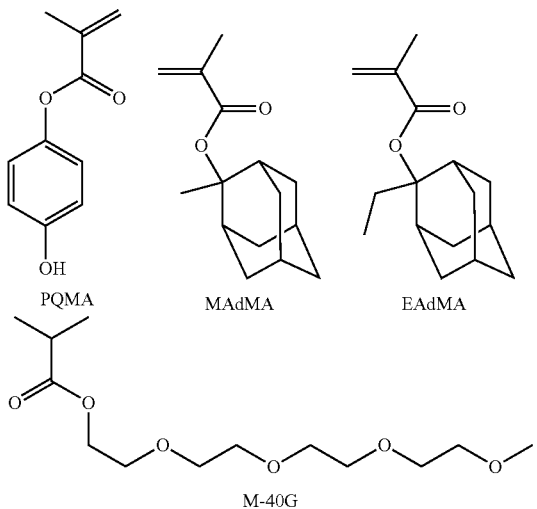

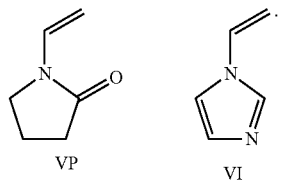

Preparation of Fine Pattern-Forming Composition

The polymers were dissolved in solvents to prepare fine pattern-forming compositions. Table 1 shows the components and the contents thereof in each composition.

Evaluation of Hole Pattern Reduction

Each prepared composition was cast on the resist pattern 1, and heated at 130° C. for 60 seconds. The pattern coated with the composition was washed with 2-heptanone, and then dried. The dimension reduction of the obtained hole pattern was measured to evaluate effect of the fine pattern-forming composition. In addition, the shape of the resultant pattern was observed with the eyes to evaluate. The pattern shape was classified into the following grades:

A: the pattern shape remained a rectangular form;

B: the pattern shape was distorted but could be recognized; and

C: the pattern shape was broken and could not be recognized.

Evaluation of Solubility

Photosensitive resin compositions AZ AX2110P and AZ AX1120P ([trademark], manufactured by AZ Electronic Materials (Japan) K.K.), which are hereinafter referred to as "Resist 1" and "Resist 2", respectively, were prepared. Each fine pattern-forming composition and Resist 1 or 2 were mixed in amounts of 50 g and 50 g, respectively. The mixture was shaken for 1 hour, and then observed with the eyes to evaluate. The state of the mixture was classified into the following grades:

A: the mixture was so clear that neither precipitate nor suspension was observed;

B: the mixture was slightly cloudy, but neither precipitate nor suspension was observed; and C: the mixture was so cloudy that precipitates or suspensions were observed.

TABLE 1

| | Polymer (monomer and ratio) | Solvent | Dimension reduction (nm) | Solubility Resist 1 | Resist 2 | Pattern shape |
|---|---|---|---|---|---|---|
| Example 1 | PQMA(100) | 2-Heptanone | 5 | A | A | A |
| Example 2 | PQMA(80)/MAdMA(20) | 2-Heptanone | 8 | A | A | A |
| Example 3 | PQMA(65)/MAdMA(35) | 2-Heptanone | 3 | A | A | A |
| Example 4 | PQMA(80)/EAdMA(20) | 2-Heptanone | 12 | A | A | A |
| Example 5 | PQMA(80)/M-40G(20) | 2-Heptanone | 10 | A | A | A |
| Example 6 | Polyhydroxystyrene | 2-Heptanone | 8 | A | A | A |
| Example 7 | PQMA(100) | 2-Heptanone | 5 | A | A | A |
| Example 8 | PQMA(80)/MAdMA(20) | Butyl acetate | 9 | A | A | A |
| Example 9 | PQMA(65)/MAdMA(35) | Butyl acetate | 4 | A | A | A |
| Example 10 | PQMA(80)/EAdMA(20) | Butyl acetate | 13 | A | A | A |
| Example 11 | PQMA(80)/M-40G(20) | Butyl acetate | 10 | A | A | A |
| Example 12 | Polyhydroxystyrene | Butyl acetate | 8 | A | A | A |
| Example 13 | PQMA(80)/MAdMA(20) | Propyl acetate | 8 | A | A | B |
| Example 14 | PQMA(80)/MAdMA(20) | Pentyl acetate | 7 | A | A | B |
| Example 15 | PQMA(80)/MAdMA(20) | Ethyl acetate | 8 | A | A | B |

TABLE 1-continued

|  | Polymer (monomer and ratio) | Solvent | Dimension reduction (nm) | Solubility Resist 1 | Solubility Resist 2 | Pattern shape |
|---|---|---|---|---|---|---|
| Example 16 | PQMA(80)/MAdMA(20) | MIBK | 8 | A | A | B |
| Comparison 1 | VP(50)/VI(50) | Water | 6 | C | C | A |
| Comparison 2 | PQMA/MAdMA | Ethyl lactate | N/A | A | A | C |
| Comparison 3 | PQMA(80)/MAdMA(20) | PGME | N/A | A | A | C |
| Comparison 4 | PQMA(80)/MAdMA(20) | PGMEA | N/A | A | A | C |
| Comparison 5 | PQMA(80)/MAdMA(20) | Cyclohexanone | N/A | A | A | C |

In the above table, N/A stands for "Not Applicable".

Evaluation of Dry Etching Resistance

A silicon wafer was spin-coated with a photosensitive resin composition (manufactured by AZ Electronic Materials (Japan) K.K.) by means of a spin coater (manufactured by Tokyo Electron Ltd.), and then baked at 130° C. for 60 seconds to form a resist layer. The thickness of the resist layer was measured to determine the value of F1(resist). After the resist layer was subjected to dry etching by means of a dry etching apparatus (manufactured by ULVAC, Inc.), the thickness the etched layer was measured to determine the value of F2(resist).

In the same manner as above, each fine pattern-forming composition was cast on a silicon wafer to form a layer of the composition. The thickness of the formed layer was measured before and after dry etching in the same manner as described above for the layer formed from the photosensitive resin composition, to determine the values of F1 and F2.

On the basis of the determined values, the dry etching resistance was calculated according the formula:

(dry etching resistance)=$(F1-F2)/(F1(\text{resist})-F2(\text{resist}))$

The results were as set forth in Table 2.

TABLE 2

|  | Polymer (monomer and ratio) | Dry etching resistance |
|---|---|---|
| Example 17 | PQMA(100) | 0.60 |
| Example 18 | PQMA(80)/MAdMA(20) | 0.64 |
| Example 19 | PQMA(65)/MAdMA(35) | 0.83 |
| Example 20 | PQMA(80)/EAdMA(20) | 0.73 |
| Example 21 | PQMA(80)/M-40G(20) | 0.95 |
| Example 22 | Polyhydroxystyrene | 0.52 |
| Comparison 6 | VP(50)/VI(50) | 1.10 |
| Reference | Resist | 1.00 |

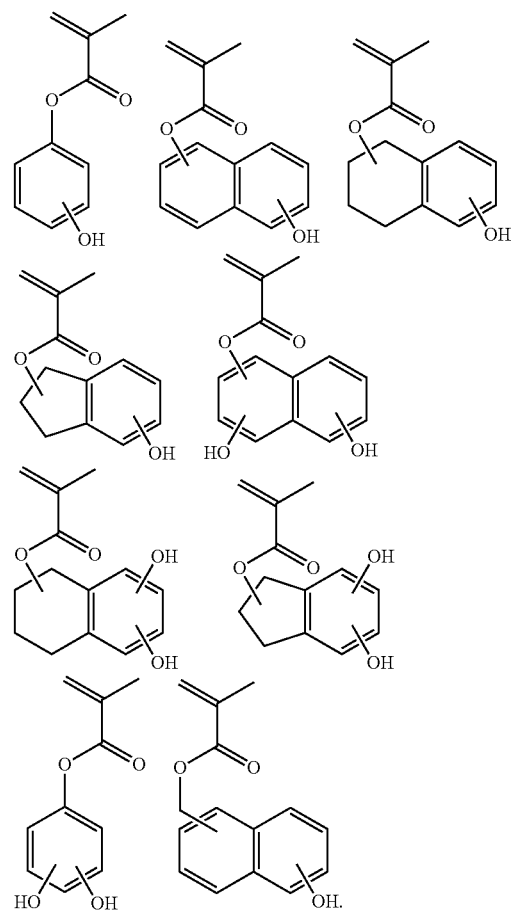

The invention claimed is:

1. A fine pattern-forming composition for miniaturizing a resist pattern by fattening in a process of forming a negative resist pattern from a chemically amplified resist composition, comprising
a polymer containing a repeating unit having a hydroxylaryl group, and an organic solvent not dissolving said negative resist pattern wherein said polymer contains the repeating unit having a hydroxyaryl group in an amount of 60 mol % or more based on the number of moles of all the repeating units,
and further wherein said repeating unit is derived from at least one monomer selected from the group consisting of 2. The fine pattern-forming composition according to claim 1, wherein said organic solvent contains 2-heptanone or butyl acetate.

3. The fine pattern-forming composition according to claim 2, which contains 2-heptanone or butyl acetate in an amount of 80 wt % or more.

4. A method for forming a fine negative resist pattern, comprising the steps of
(1) coating a semiconductor substrate with a chemically amplified resist composition, to form a photoresist layer;
(2) exposing to light said semiconductor substrate coated with said photoresist layer;
(3) developing said photoresist layer with an organic solvent developer after said exposing step, to form a photoresist pattern;
(4) coating said photoresist pattern with the fine pattern-forming composition according to claim 1;

(5) heating the coated photoresist pattern, and
(6) washing to remove excess of the fine pattern-forming composition.

5. The method according to claim 4, wherein said steps (1) and (4) are carried out by means of the same coating apparatus.

6. The method according to claim 4, wherein said step (6) is carried out by use of 2-heptanone or butyl acetate.

7. The method according to claim 5, wherein said step (6) is carried out by use of 2-heptanone or butyl acetate.

8. The fine pattern-forming composition according to claim 1, wherein said repeating unit is derived from at least one monomer selected from the group consisting of

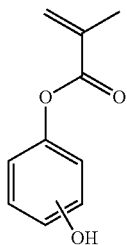 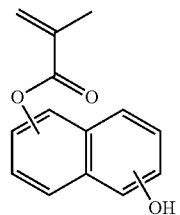

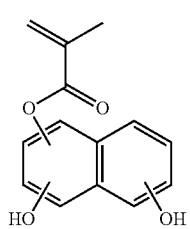 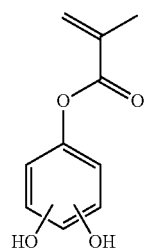

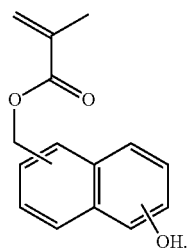

9. The fine pattern-forming composition according to claim 1, wherein said repeating unit is derived from at least one monomer selected from the group consisting of

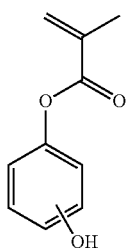 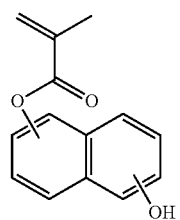

-continued

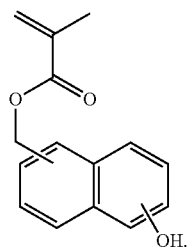

10. The fine pattern-forming composition according to claim 1, wherein said repeating unit is derived from is derived from at least one monomer selected from

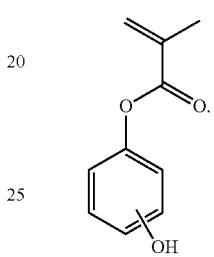

11. The fine pattern-forming composition according to claim 1, wherein the composition does not contain a compound with a free carboxyl group.

12. A fine pattern-forming composition for miniaturizing a resist pattern by fattening in a process of forming a negative resist pattern from a chemically amplified resist composition,
consisting essentially of
a polymer containing a repeating unit having a hydroxylaryl group, an organic solvent not dissolving said negative resist pattern wherein said polymer contains the repeating unit having a hydroxyaryl group in an amount of 60 mol % or more based on the number of moles of all the repeating units,
and further wherein said repeating unit is derived from at least one monomer selected from the group consisting of

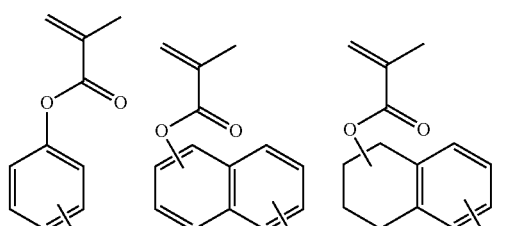

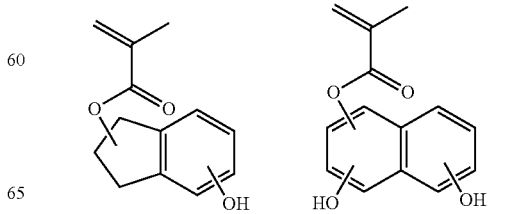

-continued
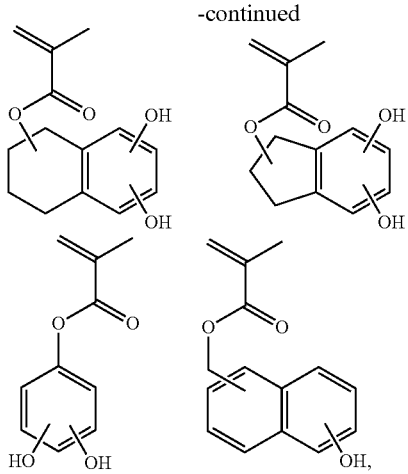
and optional additives selected from the group consisting of surfactants, germicides, antibacterial agents, antiseptic agents and anti-mold agents.
* * * * *